(12) United States Patent
Miyazaki et al.

(10) Patent No.: US 11,664,482 B2
(45) Date of Patent: May 30, 2023

(54) LIGHT-EMITTING DEVICE AND METHOD OF MANUFACTURING LIGHT-EMITTING DEVICE

(71) Applicant: NICHIA CORPORATION, Anan (JP)

(72) Inventors: Masaya Miyazaki, Tokushima (JP); Ryo Suzuki, Tokushima (JP)

(73) Assignee: Nichia Corporation, Anan (JP)

( * ) Notice: Subject to any disclaimer, the term of this patent is extended or adjusted under 35 U.S.C. 154(b) by 111 days.

(21) Appl. No.: 16/990,573

(22) Filed: Aug. 11, 2020

(65) Prior Publication Data
US 2021/0050487 A1    Feb. 18, 2021

(30) Foreign Application Priority Data

Aug. 13, 2019 (JP) .............................. JP2019-148585

(51) Int. Cl.
| | | |
|---|---|---|
| *H01L 33/50* | (2010.01) | |
| *H01L 33/00* | (2010.01) | |
| *H01L 33/60* | (2010.01) | |
| *H01L 33/54* | (2010.01) | |

(52) U.S. Cl.
CPC .......... *H01L 33/502* (2013.01); *H01L 33/005* (2013.01); *H01L 33/60* (2013.01); *H01L 2933/0058* (2013.01)

(58) Field of Classification Search
CPC ..... H01L 33/50; H01L 33/502; H01L 33/501; H01L 33/504; H01L 33/60; H01L 33/08
See application file for complete search history.

(56) References Cited

U.S. PATENT DOCUMENTS

| | | |
|---|---|---|
| 2003/0230751 A1 | 12/2003 | Harada |
| 2014/0080235 A1 | 3/2014 | Yajima et al. |
| 2015/0001563 A1 | 1/2015 | Miki |

(Continued)

FOREIGN PATENT DOCUMENTS

| | | |
|---|---|---|
| CN | 102832331 A * | 12/2012 |
| JP | 2004-56075 A | 2/2004 |

(Continued)

*Primary Examiner* — Antonio B Grite
(74) *Attorney, Agent, or Firm* — Birch, Stewart, Kolasch & Birch, LLP

(57) ABSTRACT

A light-emitting device efficiently performs wavelength conversion and includes a light-emitting element having a light-emitting surface, a wavelength conversion member having an incident surface that is larger than the light-emitting surface of the light-emitting element, a light-transmissive member that includes a first portion disposed across a lateral surface of the light-emitting element and the incident surface of the wavelength conversion member, and a light-reflective member disposed to cover the lateral surface of the light-emitting element while being in contact with the first portion of the light-transmissive member. The incident surface of the wavelength conversion member faces the light-emitting surface of the light-emitting element and has an outer periphery located outward of an outer periphery of the light-emitting surface. The light-transmissive member further includes a second portion that extends from an end portion of the first portion between the light-reflective member and the incident surface of the wavelength conversion member.

21 Claims, 11 Drawing Sheets

(56) References Cited

U.S. PATENT DOCUMENTS

| | | | |
|---|---|---|---|
| 2016/0093780 A1* | 3/2016 | Beppu | H01L 21/3213 |
| | | | 438/27 |
| 2016/0097495 A1* | 4/2016 | Yamamoto | C09K 11/665 |
| | | | 349/65 |
| 2016/0155914 A1 | 6/2016 | Miki | |
| 2017/0062671 A1* | 3/2017 | Hashimoto | H01L 33/505 |
| 2017/0092825 A1 | 3/2017 | Bando | |
| 2018/0182938 A1 | 6/2018 | Miki | |
| 2019/0035986 A1* | 1/2019 | Maeda | H01L 33/505 |
| 2019/0198729 A1* | 6/2019 | Hayashi | H01L 33/486 |

FOREIGN PATENT DOCUMENTS

| | | |
|---|---|---|
| JP | 2014-078678 A | 5/2014 |
| JP | 2015-053326 A | 3/2015 |
| JP | 2017-69368 A | 4/2017 |
| JP | 2017-228658 A | 12/2017 |

* cited by examiner

Fig. 5B1
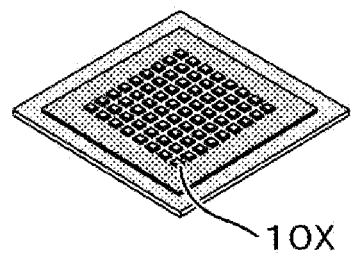
Fig. 5B2
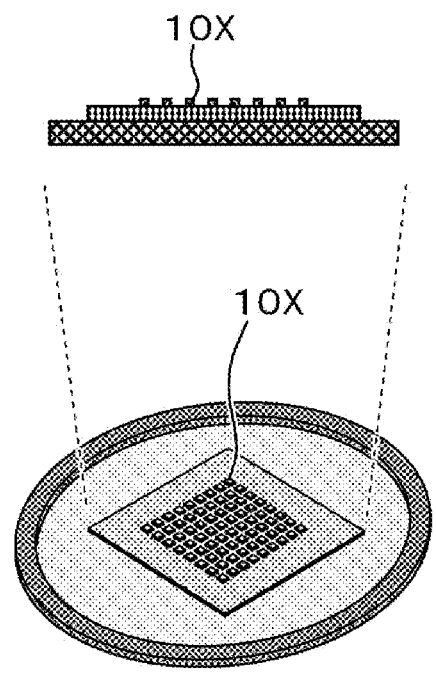
Fig. 5B3
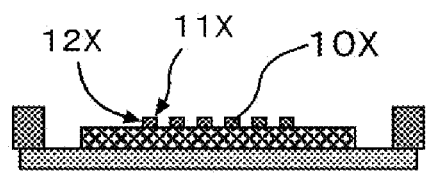

Fig. 5C1
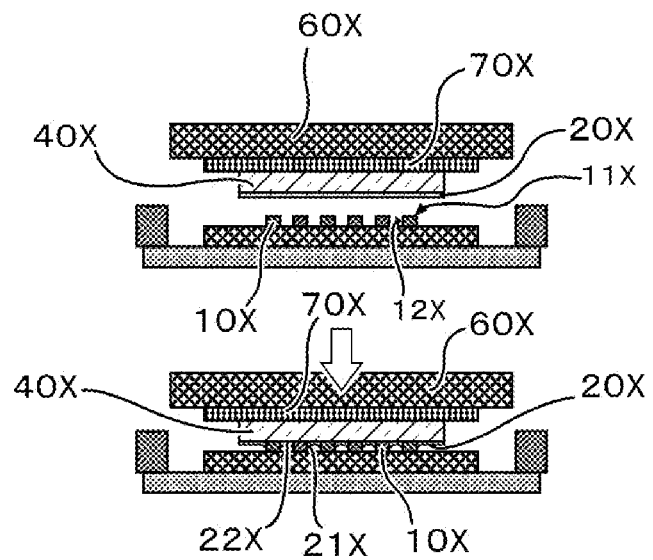
Fig. 5C2
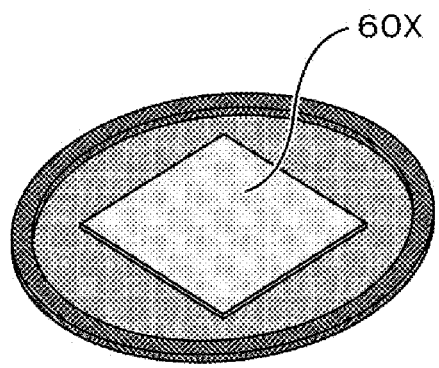

LIGHT-EMITTING DEVICE AND METHOD OF MANUFACTURING LIGHT-EMITTING DEVICE

BACKGROUND OF THE INVENTION

1. Field of the Invention

Certain embodiments of the present invention relate to a light-emitting device and a method of manufacturing the light-emitting device.

2. Description of Related Art

A known example of a light-emitting device including a light-emitting element such as a light-emitting diode (LED) includes a combination of a light-emitting element and a wavelength conversion member that is disposed to face a light-emitting surface of the light-emitting element (see Japanese Unexamined Patent Application Publication Nos. 2014-078678 and 2017-228658).

SUMMARY OF THE INVENTION

One object of certain embodiments of the present invention is to provide a light-emitting device that can efficiently perform wavelength conversion using a wavelength conversion member and a method of manufacturing the light-emitting device.

In order to achieve the above object, a light-emitting device according to one embodiment of the present invention includes a light-emitting element having a light-emitting surface, a wavelength conversion member having an incident surface that is larger than the light-emitting surface of the light-emitting element, a light-transmissive member that includes a first portion disposed across a lateral surface of the light-emitting element and the incident surface of the wavelength conversion member, and a light-reflective member disposed to cover the lateral surface of the light-emitting element while being in contact with the first portion of the light-transmissive member. The incident surface of the wavelength conversion member faces the light-emitting surface of the light-emitting element and has an outer periphery located outward of an outer periphery of the light-emitting surface of the light-emitting element. The light-transmissive member further includes a second portion that extends from an end portion of the first portion between the light-reflective member and the incident surface of the wavelength conversion member.

In order to achieve the above object, a method of manufacturing a light-emitting device according to another embodiment of the present invention includes:
(a) applying a light-transmissive resin material on a wavelength conversion sheet;
(b) disposing a plurality of light-emitting elements with respective light-emitting surfaces of the light-emitting elements facing the wavelength conversion sheet, such that the applied light-transmissive resin material is in contact with the light-emitting surface and at least a portion of a lateral surface continuous with the light-emitting surface of each of the light-emitting elements;
(c) curing the light-transmissive resin material in a state where creeping portions are connected by extending portions each of which extends from an end portion of a corresponding one of the creeping portions between the light-emitting elements that are adjacent to each other, the creeping portions being made of the light-transmissive resin material that is in contact with the lateral surface of each of the light-emitting elements; and
(d) disposing a reflective resin material between the light-emitting elements.

Effects of the Invention

Certain embodiments of the present invention provide a light-emitting device that can efficiently perform wavelength conversion using a wavelength conversion member.

BRIEF DESCRIPTION OF THE DRAWINGS

FIGS. 5B1 to 5B3 are schematic views illustrating the manufacturing flow of the light-emitting device according to the first embodiment.

FIGS. 5C1 to 5C2 are schematic views illustrating the manufacturing flow of the light-emitting device according to the first embodiment.

DETAILED DESCRIPTION OF EMBODIMENTS

Figure 1A:
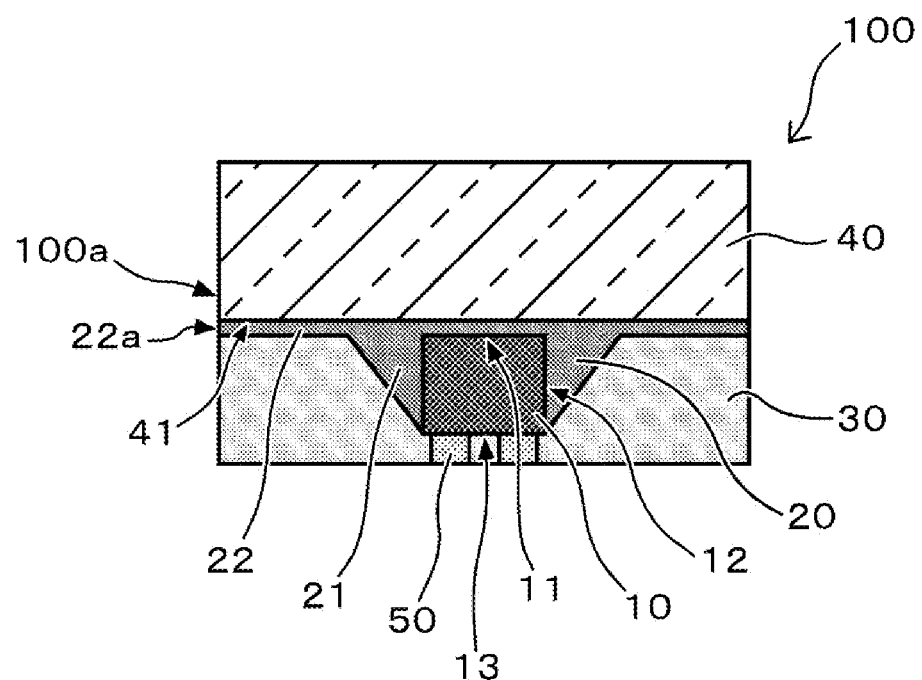
FIG. 1A is a schematic cross-sectional view of a light-emitting device according to a first embodiment.

Certain embodiments of the present invention will be described in detail below on the basis of the accompanying drawings. The descriptions below include terms indicating specific directions or positions as appropriate. These terms are, however, used to facilitate understanding of the invention referring to the drawings, and the meanings of these terms do not limit the technical scope of the present invention. Portions with the same reference numeral in a plurality of drawings represent the same or equivalent portion.

Moreover, in the embodiments described below, examples of light-emitting devices are described to give a concrete form to the technical idea of the present invention, and the present invention is not limited to the description. Unless otherwise specified, sizes, materials, shapes, and relative positions of constituent components described below are not intended to limit the scope of the present invention thereto, but rather are described as examples. Sizes or positional relationships of components illustrated in the drawings may be exaggerated in order to clarify the descriptions.

Light-Emitting Device

First Embodiment

Figure 1B:
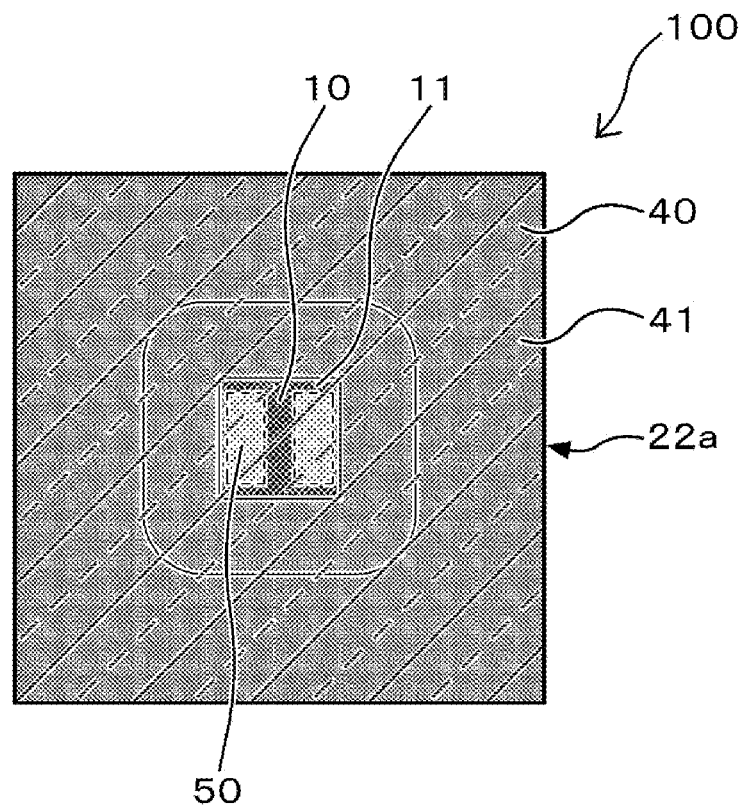
FIG. 1B is a schematic plan view of the light-emitting device according to the first embodiment.

A light-emitting device according to a first embodiment will be described below with reference to the accompanying drawings. FIG. 1A is a schematic cross-sectional view of the light-emitting device according to the first embodiment. FIG. 1B is a schematic plan view of the light-emitting device according to the first embodiment. As shown in FIG. 1A, main components of a light-emitting device 100 of the first embodiment includes a light-emitting element 10, a wavelength conversion member 40, a light-transmissive member 20, and a light-reflective member 30.

As shown in FIGS. 1A and 1B, the wavelength conversion member 40 has an incident surface 41 that has a larger width than a light-emitting surface 11 of the light-emitting element 10 in a cross-sectional view. Also, the wavelength conversion member 40 is disposed such that the incident surface 41 faces the light-emitting surface 11 of the light-emitting element 10 and that an outer periphery of the incident surface 41 is located outward of the outer periphery of the light-emitting surface 11. The light-transmissive member 20 includes a portion disposed between the light-emitting surface 11 of the light-emitting element 1 and the wavelength conversion member 40 and a first portion 21 disposed across a lateral surface 12 of the light-emitting element 10 and the incident surface 41 of the wavelength conversion member 40. The first portion 21 of the light-transmissive member 20 is formed to have a width increasing toward the incident surface 41 of the wavelength conversion member 40 in a cross-sectional view as shown in FIG. 1A. This configuration can efficiently guide light emitted from the lateral surface of the light-emitting element 10. The light-reflective member 30 is disposed to cover the lateral surfaces 12 of the light-emitting element 10. More specifically, the light-reflective member 30 covers indirectly the lateral surfaces of the light-emitting element 10 via the first portion 21 of the light-transmissive member 20. The light-reflective member 30 may include a portion that is directly in contact with a lateral surface of a semiconductor layered body of the light-emitting element 10. The light-reflective member 30 is disposed to be in contact with a lateral surface of electrodes 50 of the light-emitting element 10.

In particular, in the light-emitting device 100 of the first embodiment, the light-transmissive member 20 further includes, in addition to the first portion 21, a second portion 22 that extends from an end portion of the first portion 21 toward the outside. The second portion 22 has a thin-film shape having a smaller thickness than the thickness of the first portion 21. In the light-emitting device 100 of the first embodiment, the second portion 22 of the light-transmissive member 20 extends from the first portion 21 toward an outer surface of the light-emitting device 100 and is exposed at the outer surface as shown in FIG. 1A.

In the light-transmissive member 20 disposed as shown above, light emitted from the light-emitting element 10, particularly from the lateral surfaces of the light-emitting element 10, (1) is incident on the wavelength conversion member 40 via the first portion 21 of the light-transmissive member 20 located to cover the lateral surfaces 12 of the light-emitting element 10, and (2) is also incident on the wavelength conversion member 40 via the second portion 22 of the light-transmissive member 20.

This allows light emitted from the light-emitting element 10 to be incident on a portion near the outer periphery of the wavelength conversion member 40, so that efficient wavelength conversion in a wide range to the outer periphery or near the outer periphery of the wavelength conversion member 40 can be performed.

That is, light emitted from the light-emitting surface 11 of the light-emitting element 10 passes through the light-transmissive member 20 located between the light-emitting surface 11 of the light-emitting element 10 and the wavelength conversion member 40, and then is incident on the wavelength conversion member 40 via the incident surface that faces the light-transmissive member 20. Also, light emitted from the lateral surfaces 12 of the light-emitting element 10 is allowed to be incident on the wavelength conversion member 40 through the incident surface that faces the first portion 21 of the light-transmissive member 20 that covers the lateral surfaces 12 of the light-emitting element 10 via the first portion 21. The light is also allowed to be incident on the wavelength conversion member 40 through the incident surface that faces the second portion 22 via the second portion 22.

Further, light emitted from the light-emitting element 10 can propagate the whole of the wavelength conversion member 40. This can decrease color temperature directivity of light.

Also, utilization efficiency of the wavelength conversion member 40 can be increased, which allows luminance of light emitted from the light-emitting device 100 to be increased.

As shown in FIGS. 1A and 1B, in the first embodiment, the second portion 22 of the light-transmissive member 20 has an outer periphery edge 22a and extends between the light-reflective member 30 and the incident surface 41 of the wavelength conversion member 40 to such an extent that the outer periphery edge 22a is exposed at an outer periphery 100a of the light-emitting device 100.

This configuration allows a portion of light to be directly emitted to outside of the light-emitting device 100 through the exposed outer periphery edge 22a. Then, the portion of light can be suitably used for the light to be mixed with the wavelength-converted light emitted from the wavelength conversion member 40.

Now, components of the light-emitting device 100 will be described below.

Light-Emitting Element 10

The light-emitting element 10 includes a semiconductor layered body and electrodes. The light-emitting element 10 includes a light-emitting surface 11 (a main light-emitting surface), lateral surfaces 12 extending along a direction that is different from (for example, perpendicular to) the light-emitting surface 11, and an electrode forming surface 13 being opposite to the light-emitting surface 11 and having a pair of positive and negative electrodes 50.

A semiconductor light-emitting element capable of emitting light with an appropriately selected wavelength can be used for the light-emitting element 10. For example, a light-emitting diode can be used for the light-emitting element 10. An example of the light-emitting element 10 includes a light-emitting element that emits blue light. However, this is not a limitation, and a light-emitting element that emits light other than blue light may be used for the light-emitting element 10. In the case in which the light-emitting device includes a plurality of light-emitting elements 10 that are disposed at predetermined intervals, the light-emitting elements may emit light of the same color or different colors.

An example of the semiconductor layered body of the light-emitting element 10 that can emit blue light includes a nitride semiconductor ($In_xAl_yGa_{1-x-y}N$, $0 \leq x$, $0 \leq y$, and $x+y \leq 1$). In this case, the light-emitting element of the nitride semiconductor includes, for example, a sapphire substrate and a nitride semiconductor layered structure on the sapphire substrate. The nitride semiconductor layered structure includes an n-type nitride semiconductor layer, a p-type nitride semiconductor layer, and a light-emitting layer between the n-type nitride semiconductor layer and the p-type nitride semiconductor layer. The n-type nitride semiconductor layer and the p-type nitride semiconductor layer are electrically connected to respective electrodes 50, namely, an n-side electrode and a p-side electrode.

The light-emitting element 10 may have any shape such as square and rectangular shapes in a plan view. Such shapes may include polygonal shapes such as triangular and hexagonal shapes. In the case in which a plurality of light-emitting elements 10 are disposed at predetermined intervals, the interval may be, for example, in a range of 0.05 mm to 20 mm. For example, the light-emitting element 10 may have a size in a range of 250 µm to 1000 µm, preferably 500 µm to 750 µm, in respective longitudinal and lateral directions in a plan view. The light-emitting element 10 may have a height in a range of 100 µm to 500 µm, preferably 200 µm to 400 µm.

Light-Transmissive Member 20

The light-transmissive member 20 can transmit light emitted from the light-emitting surface 11 of the light-emitting element 10. The light-transmissive member 20 includes a portion that is disposed between the light-emitting surface 11 of the light-emitting element 10 and the wavelength conversion member 40, the first portion 21 that is in contact with the lateral surfaces of the light-emitting element 10, and the second portion 22 that has a thin-film shape and extends from the first portion 21. The above three portions are preferably integrally formed.

As shown in FIG. 1A, the first portion 21 may cover the whole of, or may cover a portion of, the lateral surfaces of the light-emitting element 10. Also, in a cross-sectional view, the width from an inner edge of the first portion 21 (a portion located directly above an outer edge of the light-emitting surface 11 of the light-emitting element 10) to an outer edge of the first portion 21 is approximately in a range of 0.07 times to 1.3 times the width of the light-emitting surface 11 of the light-emitting element 10. In the case of the light-emitting element 10 having a square shape, the width at a side portion may be different from the width at a corner portion. For example, the first portion 21 located at a side portion of the light-emitting element 10 may have the width larger than the width of the first portion 21 located at a corner portion.

In another view, the distance from an end portion of the first portion 21 to an outer surface of the light-emitting device 100 (that is, the width of the second portion 22) is, for example, in a range of 1/20 to 23/25, preferably 3/5 to 4/5, more preferably 17/25 to 3/4, of the distance from the lateral surface of the light-emitting element 10 to the outer surface of the light-emitting device 100. Specifically, if the distance from the lateral surface of the light-emitting element 10 to the lateral surface of the light-emitting device 100 is in a range of 150 µm to 190 µm, the distance from the end portion of the first portion 21 to the outer surface of the light-emitting device 100 may be in a range of 10 µm to 175 µm. For example, the distance may be in a range of 1/20 to 23/25, preferably 3/5 to 4/5, more preferably 17/25 to 3/4, of the distance from the lateral surface of the light-emitting element 10 to the outer surface of the light-emitting device 100.

The angle of the outer surface of the first portion 21 to the light-emitting surface 11 of the light-emitting element 10 may be in a range of 5 degrees to 65 degrees. As shown in FIG. 1A, the outer surface of the first portion 21 may have a straight-line shape in a cross-sectional view, or may be a convex or concave curved surface.

The first portion 21 and the second portion 22 may have a clear boundary as shown in FIG. 1A; however, the boundary may not necessarily be clear according to the manufacturing method.

Preferably, the second portion 22, which is a portion of the light-transmissive member 20, has the thickness that can transmit light emitted from the light-emitting element 10 and can suitably guide the light into the wavelength conversion member 40 facing the second portion 22. The thickness of the second portion 22 is, for example, in a range of 3 µm to 30 µm, preferably 5 µm to 25 µm, more preferably 7 µm to 20 µm, such as 8 µm.

Figure 4:
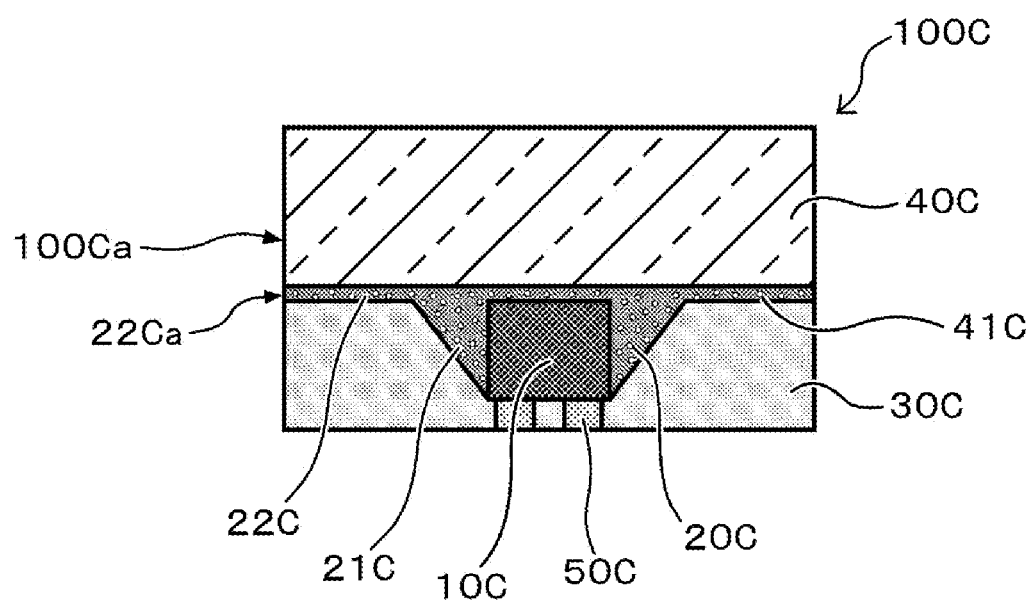
FIG. 4 is a schematic cross-sectional view of a light-emitting device according to a fourth embodiment.

The light-transmissive member may be of a single layer or may include two or more layers. As shown in FIG. 4, a light-transmissive member 20C may contain a wavelength conversion material (a phosphor). The phosphor contained in the light-transmissive member 20C may be the same as, or different from, the phosphor contained in the wavelength conversion member. Alternatively, as shown in FIG. 4, the light-transmissive member 20C may contain a light-diffusing material. This configuration allows light emitted from the light-emitting element to be easily diffused, so that unevenness in luminance and unevenness in color can be easily equalized. In the case in which the light-transmissive member includes two or more layers, one layer may include the wavelength conversion material. Alternatively, one layer may include a light-diffusing material.

Examples of the material for the light-transmissive member 20 include silicone resins, epoxy resins, and acrylic resins.

Wavelength Conversion Member 40

The wavelength conversion member 40 can absorb light emitted from the light-emitting element 10 and convert the light into light having a different wavelength. As described above, the wavelength conversion member 40 has the incident surface 41 that is larger than the light-emitting surface 11 of the light-emitting element 10. Also, in the wavelength conversion member 40, the incident surface 41 faces the light-emitting surface 11 of the light-emitting element 10, and an outer periphery of the incident surface 41 is located outward of the outer periphery of the light-emitting surface 11.

The wavelength conversion member 40 contains a wavelength conversion material such as phosphors. Examples of phosphors includes YAG phosphors (($Y,Lu,Gd)_3(Al,Ga$)

$_5$O$_{12}$:Ce) that emit yellow light, β-SiAlON phosphors that emit green light, fluoride phosphors (such as K$_2$(Si,Ti,Ge)F$_6$:Mn) that emit red light, and nitride phosphors (such as (Sr,Ca)AlSiN$_3$:Eu). The wavelength conversion member 40 may contain a single wavelength conversion material or a plurality of wavelength conversion materials.

Light-Reflective Member 30

The light-reflective member 30 reflects light and includes, for example, a white resin that is made of transparent resins mixed with a light-reflecting white powder and the like. For example, a resin containing inorganic white powders such as titanium oxide mixed in a silicone resin is used for the light-reflective member 30.

As described above, the light-reflective member 30 directly or indirectly covers the lateral surfaces 12 of the light-emitting element 10 and is in contact with the first portion 21. The light-reflective member 30 is also in contact with the electrode forming surface 13 of the light-emitting element 10. The first portion 21 of the light-emitting element 10 is formed to have a width in a cross-sectional view that increases toward the wavelength conversion member 40 facing the light-emitting surface 11 of the light-emitting element 10. Hence, the light-reflective member 30 that is in contact with the first portion 21 can have an inclined surface increasing outside toward the wavelength conversion member 40.

The light-reflective member 30 having such a configuration allows light emitted from the lateral surfaces 11 and the electrode forming surface 13 of the light-emitting element 10 to be reflected, and the reflected light is guided into the wavelength conversion member 40 that faces the light-emitting surface 11 of the light-emitting element 10. In particular, the light-reflective member 30 has an inclined surface increasing outside toward the wavelength conversion member 40. This facilitates light reflected along the inclined surface to be easily guided toward the wavelength conversion member 40.

In view of suitably reflecting light emitted from the light-emitting element 10, the light-reflective member 30 may be a white resin having reflectivity of 60% or more, preferably 90% or more, with respect to the light.

Second Embodiment

A light-emitting device 100A of a second embodiment differs from the light-emitting device 100 of the first embodiment in that an outer periphery edge 22Aa of a second portion 22A of a light-transmissive member 20A is not exposed from an outer lateral surface of the light-emitting device 100A. In the light-emitting device 100A of the second embodiment, a wavelength conversion member 40A is located outward of the outer periphery edge 22Aa of the second portion 22A (see FIG. 2). Thus, substantially only the light that has been wavelength-converted in the wavelength conversion member is suitably used for emitting light.

This configuration allows the wavelength conversion member 40A located outward of the outer periphery edge 22Aa of the second portion 22A to efficiently perform wavelength conversion. Then, light emitted from the light-emitting element 10A is wavelength-converted and emitted toward the outside.

Third Embodiment

Figure 3:
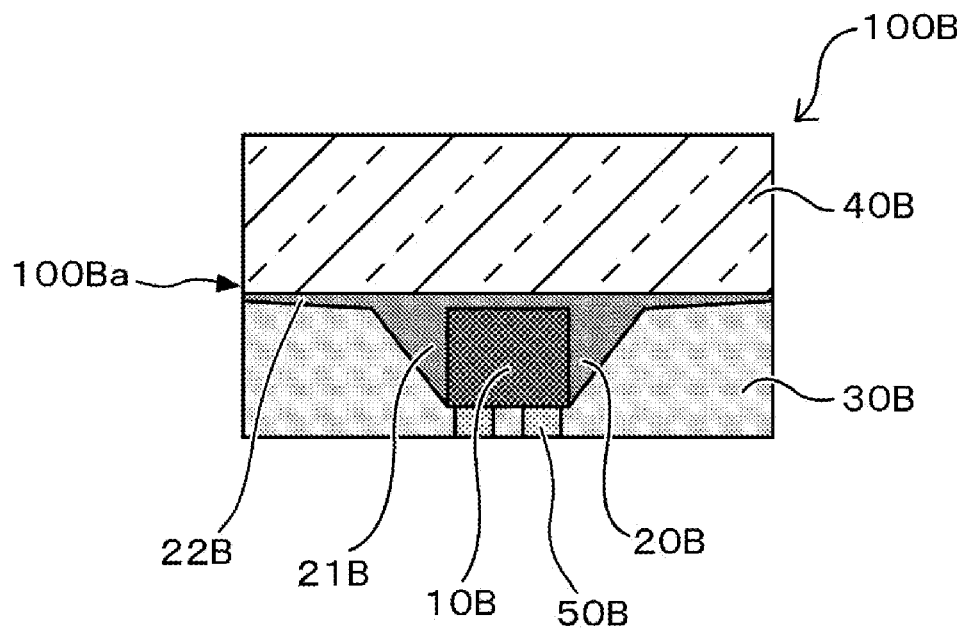
FIG. 3 is a schematic cross-sectional view of a light-emitting device according to a third embodiment.

A light-emitting device 100B of a third embodiment differs from the light-emitting device of the first embodiment in that a second portion 22B of a light-transmissive member 20B has an uneven thickness. More specifically, the thickness of the light-transmissive member 20B at an outer surface 100Ba side of a light-emitting device 100B is smaller than the thickness at the first portion 22B side (see FIG. 3). In particular, the thickness of the second portion 22B preferably decreases gradually toward the outer surface of the light-emitting device 100B.

In the light-emitting device 100B of the third embodiment having the above configuration, light emitted from the light-emitting element may be directly guided to the outside of the light-emitting device through the outer periphery edge of the second portion by adjusting the decreasing degree of the thickness of the second portion 22B toward the outer surface 100Ba. Alternately, the configuration may be such that light emitted from the light-emitting element is not substantially emitted directly from the outer periphery edge of the second portion. In the light-emitting device 100B of the third embodiment, the amount of light that is incident on the wavelength conversion member 40B and the amount of light that is emitted from the light-emitting element 10B and is directly guided to the outside of the light-emitting device 100B can be controlled by adjusting the decreasing degree of the thickness of the second portion 22B toward the outer surface 100Ba.

Method of Manufacturing Light-Emitting Device

The method of manufacturing the light-emitting device according to the first to third embodiments will be described below. The light-emitting device 100 according to the first embodiment will be mainly described below as an example.

The method of manufacturing the light-emitting device of the first embodiment mainly includes steps below.

Figure 5A:
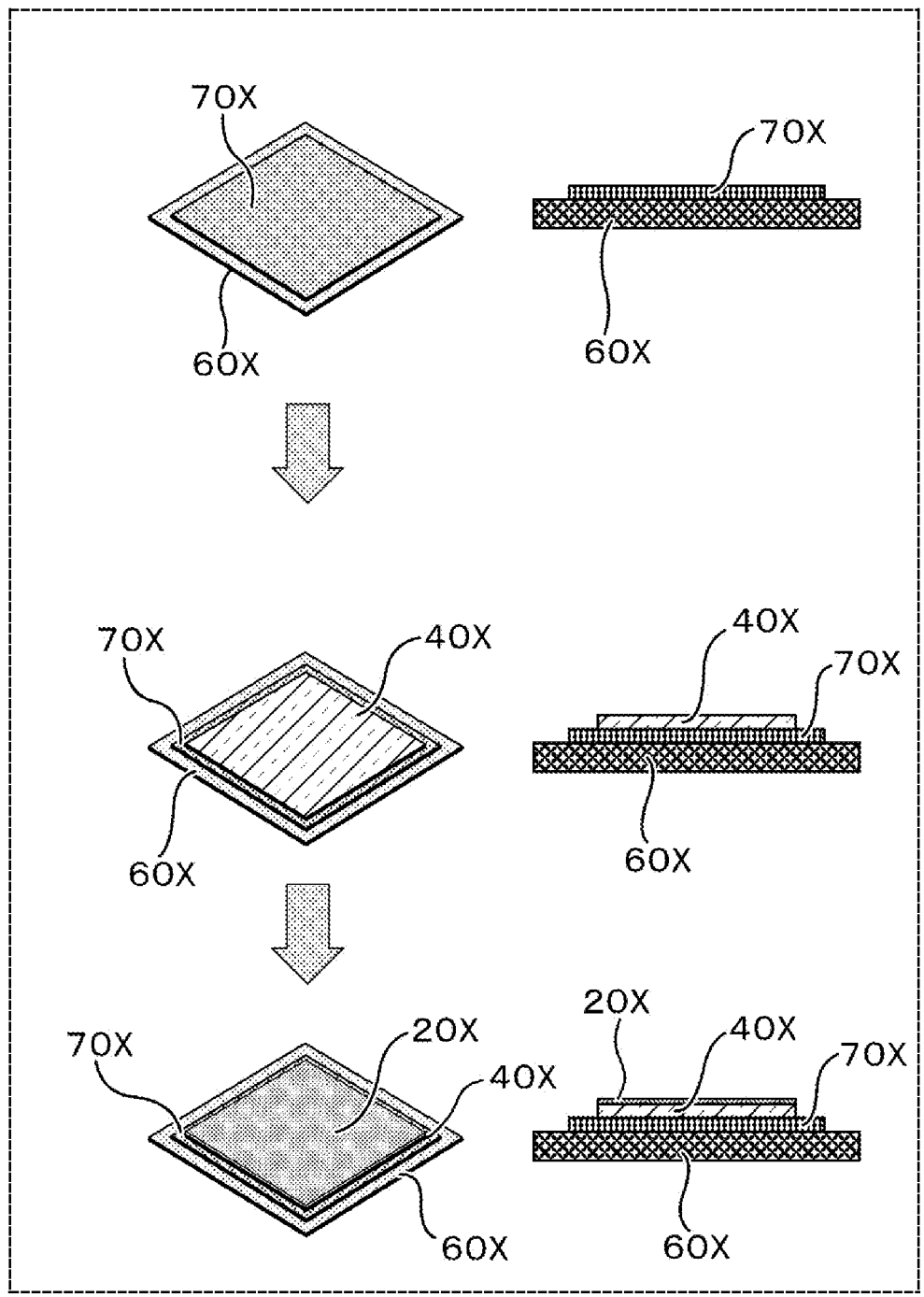
FIG. 5A is a schematic view illustrating a manufacturing flow of the light-emitting device according to the first embodiment.
Figure 6A:
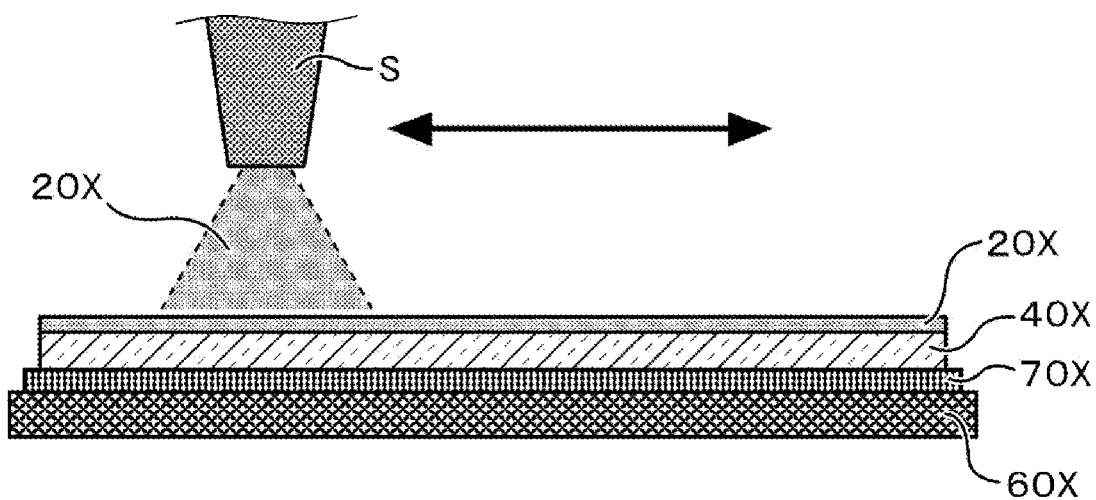
FIG. 6A is a schematic view illustrating the manufacturing flow of the light-emitting device according to the first embodiment.
Figure 6B:
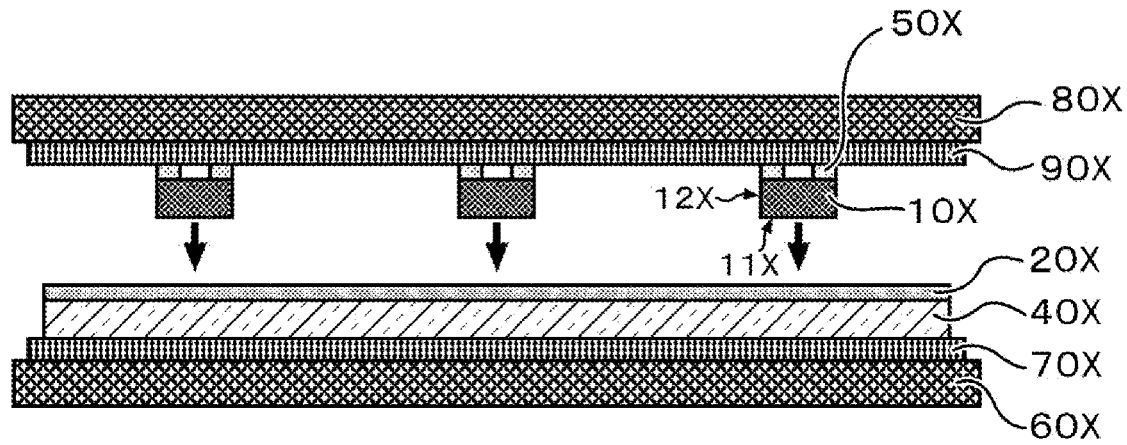
FIG. 6B is a schematic view illustrating the manufacturing flow of the light-emitting device according to the first embodiment.
Figure 6C:
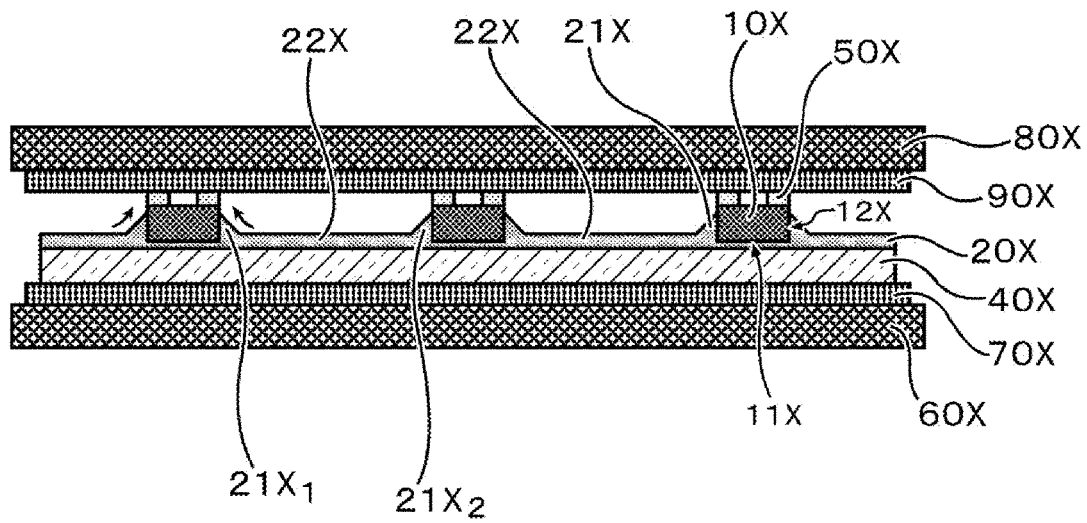
FIG. 6C is a schematic view illustrating the manufacturing flow of the light-emitting device according to the first embodiment.

(a) Step of Applying (See FIGS. 5A and 6A)

In the step of applying, a light-transmissive resin material 20X is applied to a wavelength conversion sheet 40X.

First, an adhesive resin member 70X (corresponding to a double-sided bonding member) is attached on a base member 60X, and the wavelength conversion sheet 40X is attached on the adhesive resin member 70X. Next, the light-transmissive resin material 20X is applied to the wavelength conversion sheet 40X.

The light-transmissive resin material 20X may be sprayed on the wavelength conversion sheet 40X using a spray S. Through spraying, the light-transmissive resin material 20X can be continuously applied to the wavelength conversion sheet 40X. The application of the light-transmissive resin material 20X on the wavelength conversion sheet 40X may be repeated multiple times. With multiple-times applying, the applied light-transmissive resin material 20X has an increase in the whole of the thickness.

The number of applications of the light-transmissive material 20X may be, for example, in a range of 1 to 12, preferably 2 to 10, more preferably 3 to 8, such as 6. The thickness of the light-transmissive resin material 20X per application may be in a range of 0.5 μm to 2.0 μm, preferably, 0.7 μm to 1.8 μm, more preferably 0.9 μm to 1.6 μm, such as 1.3 μm. This allows for the second portion 22 of the light-transmissive member 20 obtained by using the light-transmissive material 20X to have the suitable thickness in the finally obtained light-emitting device (see FIG. 1A and other drawings).

Figure 2:
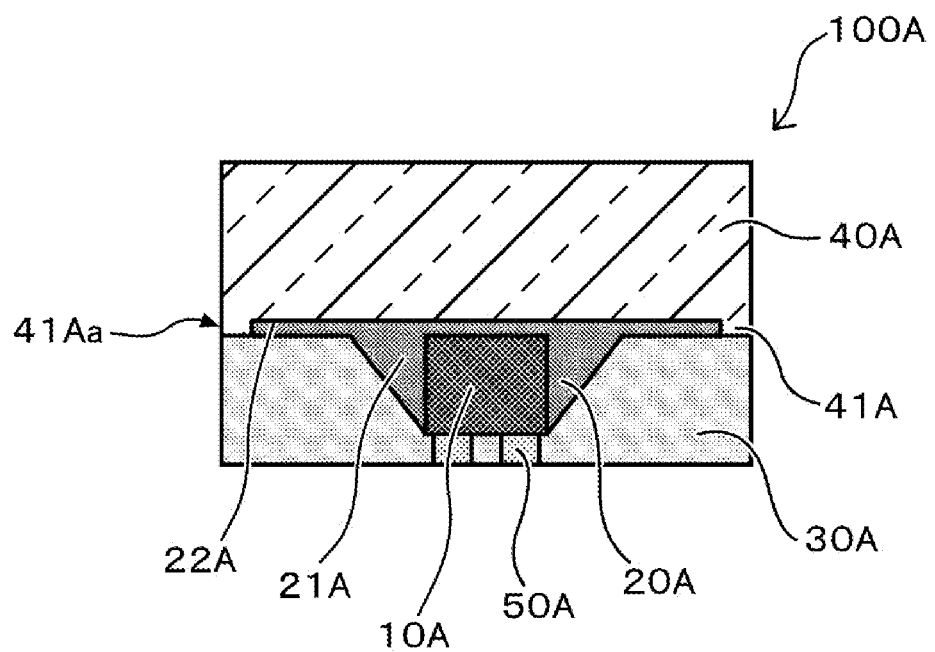
FIG. 2 is a schematic cross-sectional view of a light-emitting device according to a second embodiment.

In the case in which the light-transmissive member 20A is spaced apart from the outer surface of the light-emitting device 100A as shown in the second embodiment (FIG. 2), the light-transmissive material 20X that is applied to the whole surface as described above may be partially removed. In this case, a lateral surface of an extending portion 22A of the light-transmissive member 20X is in contact with the light-reflective member 30A instead of the wavelength conversion member 40A as shown in FIG. 2. In an alternative method, a recess is formed in advance on the wavelength conversion sheet 40X to dispose the light-transmissive material 20X only on the recess. In this case, the lateral surface of the extending portion 22A of the light-transmissive member 20A, as shown in FIG. 2, is in contact with the wavelength conversion member 40A.

In the case of the light-transmissive member 20B having an uneven thickness at the extending portion 22B as shown in the third embodiment (FIG. 3), the thicker portion can be formed by applying the light-transmissive material 20X on a portion, not on the whole surface. For example, the thickness of the light-transmissive material at an area on which the light-emitting element is to be mounted can be increased by making the number of applications to the area on which the light-emitting element is to be mounted greater than the number of applications to an area on which the light-emitting element is not mounted.

Further, by mixing phosphors and diffusion members in the light-transmissive material, the light-emitting device as shown in FIG. 4 can be obtained.

Before applying the light-transmissive resin material 20X on the wavelength conversion sheet 40X, the surface to be applied of the wavelength conversion sheet 40X may be roughened. This can enhance adhesion of the light-transmissive member made of the light-transmissive resin material 20X to the wavelength conversion member made of the wavelength conversion sheet 40X in the finally obtained light-emitting device.

(b) Step of Disposing Elements (See FIGS. 5B1 to 5B3, 5C1 to 5C2, 6B, and 6C)

In the step of disposing elements, a plurality of light-emitting elements 10X are disposed on the wavelength conversion sheet 40X.

First, a base member 80X is provided. Then, the respective electrodes 50 of each light-emitting element 10X are bonded to the base member 80X. Specifically, concurrently with or subsequent to the step of applying the light-transmissive material 20X on the wavelength conversion sheet 40X, the light-emitting elements 10X are bonded to the base member 80X via an adhesive material 90X.

With the light-emitting elements 10X bonded to the base member 80X, the light-transmissive material 20X on the wavelength conversion sheet 40X is bonded to a light-emitting surface 11X of each light-emitting element 10X to face each other.

With this configuration, a portion of the light-transmissive material 20X that is applied continuously to an upper surface of the wavelength conversion sheet 40X before bonding creeps up lateral surfaces 12X of each light-emitting element 10X to cover the lateral surfaces of the light-emitting elements 10X after bonding. Then, a creeping portion 21X and an extending portion 22X that extends from an end portion of the creeping portion 21X are formed. After bonding, a creeping portion $21X_1$ that is located at the lateral surfaces 12X of a first light-emitting element 10X and a creeping portion $21X_2$ that is located at the lateral surfaces 12X of a second light-emitting element 10X adjacent to the first light-emitting element 10X may be connected via extending portions 22X that extend from end portions of the creeping portions $21X_1$ and $21X_2$ adjacent to each other and continuously formed along the upper surface of the wavelength conversion sheet 40X (see FIG. 6C).

The creeping portion 21X has the height (a degree of creeping) that can be controlled by properties such as the thickness, viscosity, and the like of the light-transmissive resin material 20X to be applied to the wavelength conversion sheet 40X. The height of the creeping portion 21X (the degree of creeping) can be thus controlled by adjusting the above properties as appropriate. By adjusting the height of the creeping portion 21X, the thickness of the extending portion 22X that extends continuously from the creeping portion 21X can be changed. Hence, for example, the thickness of the extending portion 22X (that corresponds to the second portion 22B of the finally obtained light-transmissive member 20B) can be substantially equalized as a whole. Alternatively, the thickness of the extending portion 22X (that corresponds to the second portion 22B of the finally obtained light-transmissive member 20B) can be gradually decreased toward the outer surface.

In the finally obtained light-emitting device 100, the first portion 21 of the light-transmissive member 20 corresponds to the creeping portion 21X in this step, and the second portion 22 of the light-transmissive member 20 corresponds to the extending portion 22X in this step. In this step, the creeping portion $21X_1$ formed at the first light-emitting element 10X and the creeping portion $21X_2$ formed at the second light-emitting element 10X that is adjacent to the first light-emitting element 10X are connected via the extending portions 22X. This configuration allows the second portion 22 to extend from the end portion of the first portion 21 of the light-transmissive member 20 of the finally obtained light-emitting device 100 to the outer surface of the light-emitting device 100.

Figure 7A:
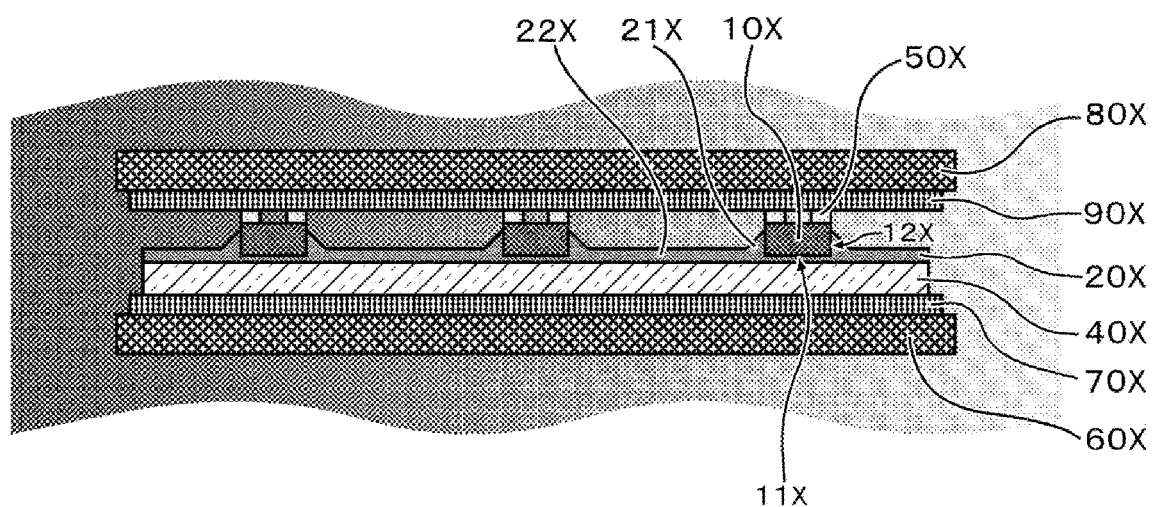
FIG. 7A is a schematic view illustrating the manufacturing flow of the light-emitting device according to the first embodiment.

(c) Step of Curing Light-Transmissive Material (See FIG. 7A)

In the step of curing the light-transmissive material, the light-transmissive material 20X is cured. Specifically, in the step of curing the light-transmissive resin material, the light-transmissive material 20X is cured in a state where the creeping portions 21X, each of which is made of the light-transmissive material 20X and is in contact with the lateral surfaces 12X of each of the light-emitting elements 10X, are connected by the extending portions 22X, each of which extends from an end portion of a corresponding one of the creeping portions 21X between the light-emitting elements 10X that are adjacent to each other. Curing methods include, for example, heating in a heater at a temperature in a range of 100° C. to 150° C. for 0.15 hour to 2 hours.

Figure 7B:
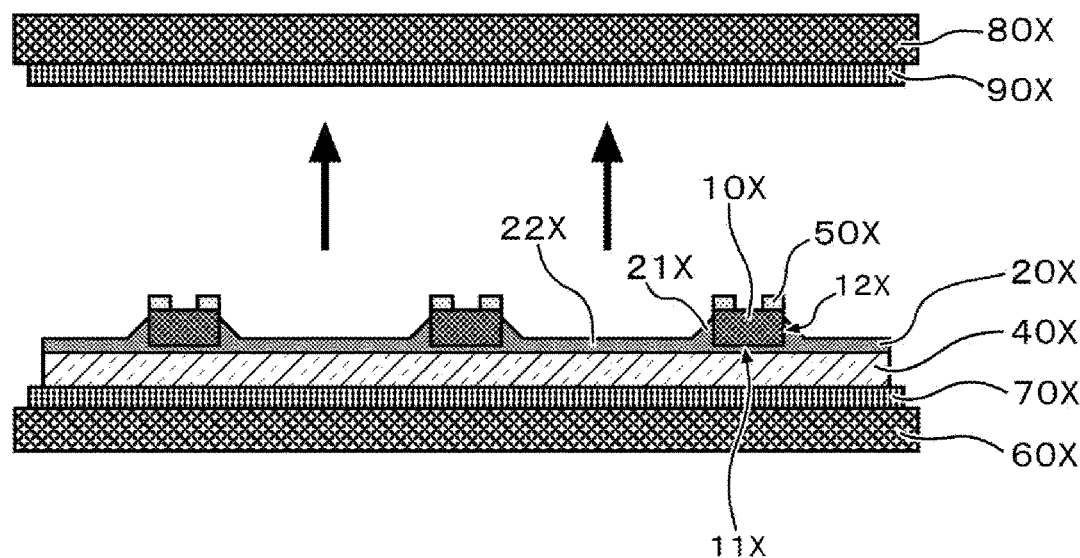
FIG. 7B is a schematic view illustrating the manufacturing flow of the light-emitting device according to the first embodiment.
Figure 8A:
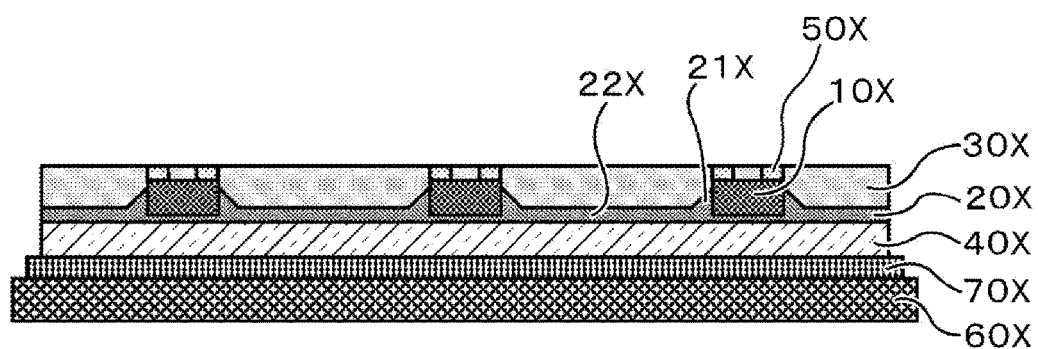
FIG. 8A is a schematic view illustrating the manufacturing flow of the light-emitting device according to the first embodiment.

(d) Step of Disposing Reflective Material (See FIGS. 7B and 8A)

In the step of disposing the reflective material, the reflective material 30X is disposed between the light-emitting elements 10X.

Specifically, after the light-transmissive material 20X is cured, the base member 80X with the adhesive material 90 is removed from the light-emitting elements 10X. This can expose electrodes 50X of the light-emitting elements 10X.

After removing the base member 80X with the adhesive material 90 from the light-emitting elements 10X, the reflective material 30X is disposed between the light-emitting elements 10X that are disposed at predetermined intervals. Specifically, the reflective material 30X is disposed to cover the light-emitting elements 10X and the cured light-transmissive material 20X by compression molding, transfer molding, printing, potting, and the like. After disposing the reflective material 30X, the reflective material 30X is cured. Curing methods include, for example, heating in a heater at a temperature in a range of 60° C. to 150° C. for 1 hour to 4 hours.

Before disposing the reflective material 30X, the cured light-transmissive material 20X may be roughened. This can enhance adhesion between the light-reflective member and the light-transmissive member in the finally obtained light-emitting device.

Figure 8B:
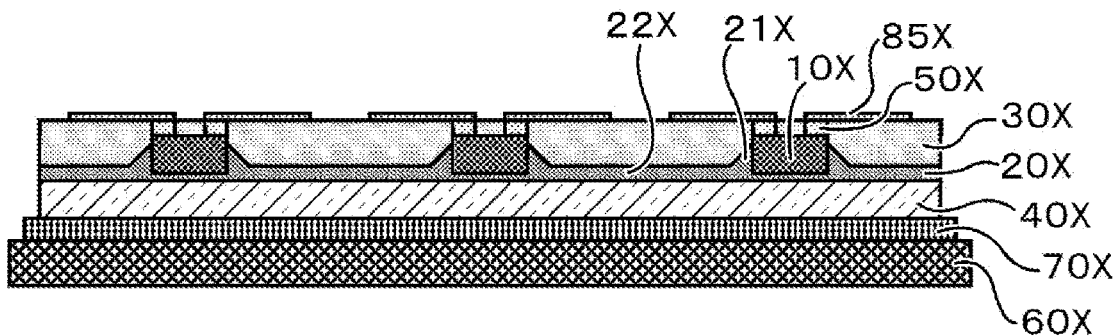
FIG. 8B is a schematic view illustrating the manufacturing flow of the light-emitting device according to the first embodiment.
Figure 8C:
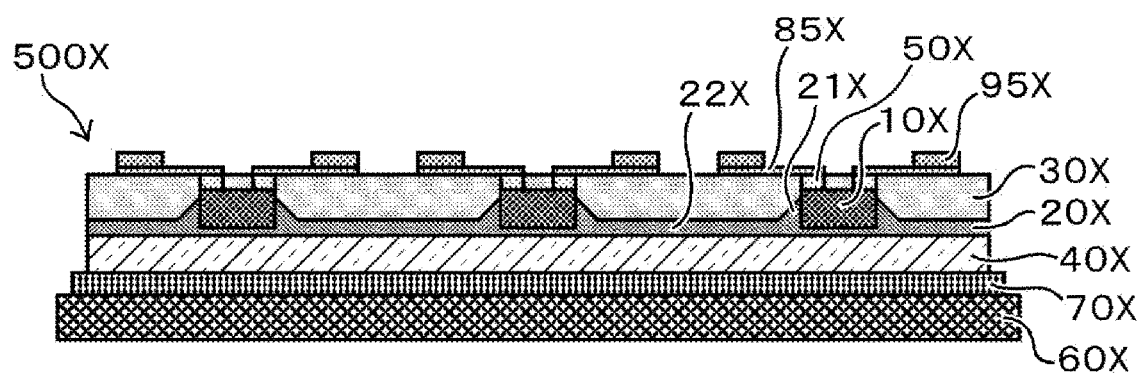
FIG. 8C is a schematic view illustrating the manufacturing flow of the light-emitting device according to the first embodiment.
Figure 8D:
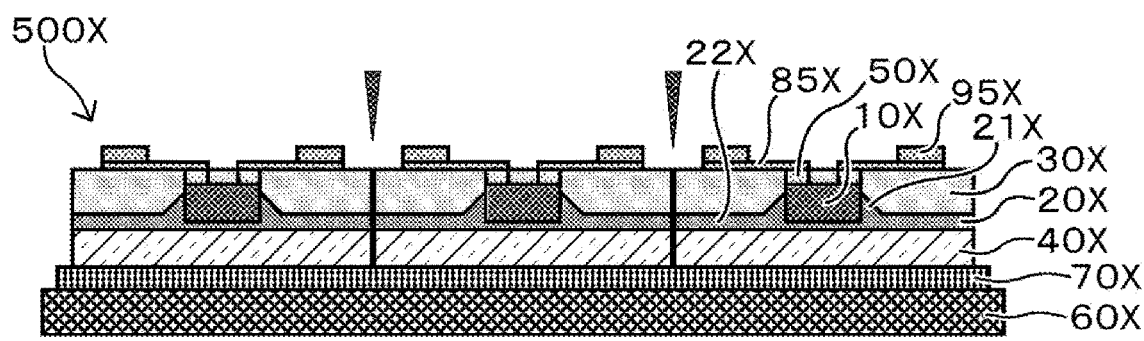
FIG. 8D is a schematic view illustrating the manufacturing flow of the light-emitting device according to the first embodiment.

After disposing and curing the reflective resin material 30, a wiring 85X that can be electrically connected with the electrodes 50X on each light-emitting element 10X is formed by sputtering, printing, and the like (see FIG. 8B). After forming the wiring 85X, an electrode 95X can be formed on the wiring 85X by printing and the like (see FIG. 8C). With the above structure, a light-emitting device composite 500X that includes light-emitting elements 10X being disposed at predetermined intervals can be obtained. Finally, the light-emitting device composite 500X is cut by dicing and the like (see FIG. 8D). More specifically, the wavelength conversion member, the light-transmissive member, the light-reflective member, and the like are cut and singulated into light-emitting devices, each of which includes a single light-emitting element 10X.

Figure 8E:
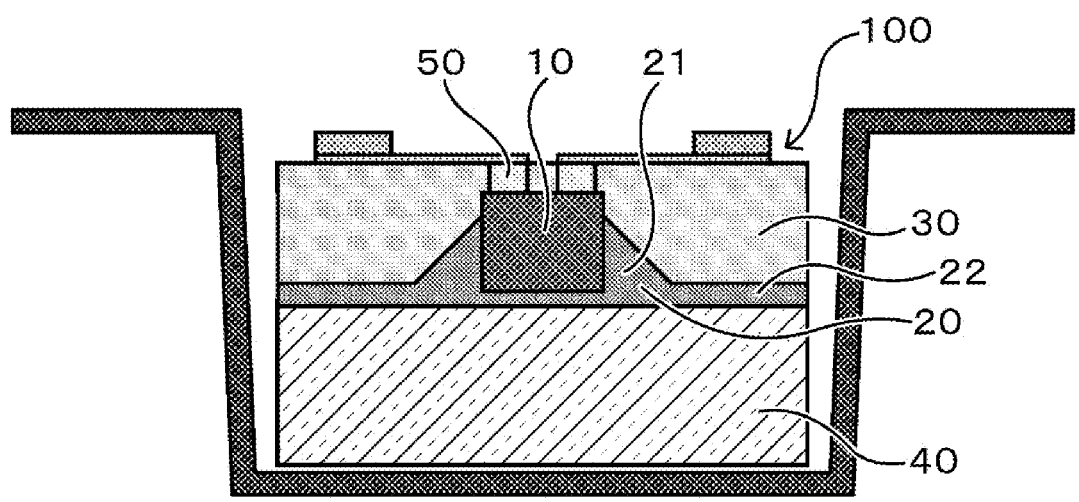
FIG. 8E is a schematic view illustrating the manufacturing flow of the light-emitting device according to the first embodiment.

Through the steps described above, the light-emitting device 100 of the first embodiment (see FIG. 1A) is finally obtained (see FIG. 8E). The light-emitting device 100 according to the first embodiment can be used for a light source of a surface-emitting device. For example, the light-emitting device 100 is bonded to the main surface of a light guide plate. The light guide plate can be made of, for example, a thermoplastic resin such as polycarbonate. The light guide plate can be formed by, for example, injection molding, compression molding, and the like.

The embodiment of the present invention has been described. However, the description simply shows a typical example within a scope of the present invention. Those skilled in the art will easily understand that the present invention is not limited by these descriptions and encompasses various modifications.

INDUSTRIAL APPLICABILITY

The light-emitting device according to certain embodiments can be employed for a backlight of televisions, tablet devices, or liquid crystal display devices and can be suitably used for televisions, tablet devices, smartphones, smartwatches, head-up displays, digital signage devices, bulletin boards, or the like. The light-emitting device according to certain embodiments can also be used as light sources for lighting such as emergency lights, line lighting devices, various illuminations, or illuminations to be installed in vehicles.

The invention claimed is:

1. A light-emitting device comprising:
   a light-emitting element having a light-emitting surface;
   a wavelength conversion member having an incident surface that is larger than the light-emitting surface of the light-emitting element;
   a light-transmissive member that includes a first portion disposed across a lateral surface of the light-emitting element and the incident surface of the wavelength conversion member; and
   a light-reflective member disposed to cover the lateral surface of the light-emitting element while being in contact with the first portion of the light-transmissive member;
   wherein the incident surface of the wavelength conversion member faces the light-emitting surface of the light-emitting element and has an outer periphery located outward of an outer periphery of the light-emitting surface of the light-emitting element,
   wherein the light-transmissive member further includes a second portion that extends from an end portion of the first portion between the light-reflective member and the incident surface of the wavelength conversion member, and
   wherein the second portion of the light-transmissive member has a region having a thickness that gradually decreases toward an outer surface of the light-emitting device.

2. The light-emitting device according to claim 1, wherein an outer periphery edge of the second portion of the light-transmissive member is exposed from an outer periphery of the light-emitting device.

3. The light-emitting device according to claim 1, wherein the wavelength conversion member is disposed between an outer periphery edge of the second portion of the light-transmissive member and an outer periphery edge of the incident surface.

4. The light-emitting device according to claim 1, wherein the light-transmissive member includes a wavelength conversion material.

5. The light-emitting device according to claim 1, wherein the light-transmissive member includes a light-diffusing material.

6. The light-emitting device according to claim 1, wherein an outer periphery edge of the second portion of the light-transmissive member is exposed from an outer periphery of the light-emitting device, and
   wherein the wavelength conversion member is disposed between an outer periphery edge of the second portion of the light-transmissive member and an outer periphery edge of the incident surface.

7. The light-emitting device according to claim 1, wherein an outer periphery edge of the second portion of the light-transmissive member is exposed from an outer periphery of the light-emitting device, and
   wherein the light-transmissive member includes a light-diffusing material.

8. A method of manufacturing a light-emitting device, comprising:
   (a) applying a light-transmissive resin material on a wavelength conversion sheet;
   (b) disposing a plurality of light-emitting elements with respective light-emitting surfaces of the light-emitting elements facing the wavelength conversion sheet, such that the applied light-transmissive resin material is in contact with the light-emitting surface and at least a portion of a lateral surface continuous with the light-emitting surface of each of the light-emitting elements;
   (c) curing the light-transmissive resin material in a state where creeping portions are connected by extending portions each of which extends from an end portion of a corresponding one of the creeping portions between the light-emitting elements that are adjacent to each other, the creeping portions being made of the light-transmissive resin material that is in contact with the lateral surface of each of the light-emitting elements; and
   (d) disposing a reflective resin material between the light-emitting elements prior to cutting the extending portions of the cured light-transmissive resin material connecting the creeping portions between adjacent light-emitting elements.

9. The method of manufacturing a light-emitting device according to claim 8, wherein the step of applying is performed by spraying.

10. The method of manufacturing a light-emitting device according to claim 8, wherein the step of applying is repeated multiple times.

11. The method of manufacturing a light-emitting device according to claim 8, wherein the light-transmissive resin material contains a light-diffusing material.

12. The method of manufacturing a light-emitting device according to claim 8, wherein the light-transmissive resin material contains a wavelength conversion material.

13. The method of manufacturing a light-emitting device according to claim 8, further comprising:
    before the step of disposing the light-emitting elements, providing a base member and bonding an electrode surface of each of the light-emitting elements to the base member,
    wherein in the step of disposing the light-emitting elements, the light-emitting elements are disposed at a time with the light-emitting surface of each of the light-emitting elements bonded to the base member, facing the wavelength conversion sheet.

14. The method of manufacturing a light-emitting device according to claim 13, further comprising:
    after the step of curing the light-transmissive resin material, removing the base member.

15. The method of manufacturing a light-emitting device according to claim 13, wherein the base member is an adhesive sheet.

16. A light-emitting device comprising:
    a light-emitting element having a light-emitting surface;
    a wavelength conversion member having an incident surface that is larger than the light-emitting surface of the light-emitting element;
    a light-transmissive member that includes a first portion disposed across a lateral surface of the light-emitting element and the incident surface of the wavelength conversion member; and
    a light-reflective member disposed to cover the lateral surface of the light-emitting element while being in contact with the first portion of the light-transmissive member;
    wherein the incident surface of the wavelength conversion member faces the light-emitting surface of the light-emitting element and has an outer periphery located outward of an outer periphery of the light-emitting surface of the light-emitting element, and
    wherein the light-transmissive member further includes a second portion that extends from an end portion of the first portion between the light-reflective member and the incident surface of the wavelength conversion member,
    wherein the light-reflective member at least partially covers a bottom surface of the light-emitting element, and
    wherein an outer periphery edge of the second portion of the light-transmissive member is exposed from an outer periphery of the light-emitting device.

17. The light-emitting device according to claim 16, wherein the wavelength conversion member is disposed between an outer periphery edge of the second portion of the light-transmissive member and an outer periphery edge of the incident surface.

18. The light-emitting device according to claim 16, wherein the second portion of the light-transmissive member has a region having a thickness that gradually decreases toward an outer surface of the light-emitting device.

19. The light-emitting device according to claim 16, wherein the light-transmissive member includes a light-diffusing material.

20. The light-emitting device according to claim 16,
    wherein the wavelength conversion member is disposed between an outer periphery edge of the second portion of the light-transmissive member and an outer periphery edge of the incident surface.

21. The light-emitting device according to claim 16, wherein the light-transmissive resin material contains a wavelength conversion material.

* * * * *